United States Patent [19]

Fujimagari et al.

[11] Patent Number: 5,243,177
[45] Date of Patent: Sep. 7, 1993

[54] IMAGE SENSOR WITH NOISE REDUCTION AND DIMINISHMENT OF RESIDUAL IMAGES

[75] Inventors: Hiroshi Fujimagari; Chikaho Ikeda; Junji Okada, all of Kanagawa, Japan

[73] Assignee: Fuji Xerox Co., Ltd., Tokyo, Japan

[21] Appl. No.: 912,996

[22] Filed: Jul. 14, 1992

[30] Foreign Application Priority Data

Jul. 17, 1991 [JP] Japan .................. 3-176901

[51] Int. Cl.⁵ .......................................... H01J 40/14
[52] U.S. Cl. .................... 250/208.1; 257/443
[58] Field of Search ............ 250/208.1, 211 J, 211 R, 250/578.1; 358/213.22, 213.26, 213.11, 213.15, 213.18; 357/30, 4; 257/53, 443, 448

[56] References Cited

U.S. PATENT DOCUMENTS

| | | | |
|---|---|---|---|
| 4,555,636 | 11/1985 | Fujisawa et al. | 250/208.1 |
| 4,714,836 | 12/1987 | Kitamura et al. | 250/578 |
| 4,746,804 | 5/1988 | Kitamura et al. | 250/578 |
| 4,916,304 | 4/1990 | Itabashi et al. | 250/578.1 |
| 5,004,903 | 4/1991 | Kitamura et al. | 357/30 |

OTHER PUBLICATIONS

Discussion of Sandwich Type a-Si Two Dimensional Optical Sensor, 46th Applied Physic Institute, Oct. 1980.

Primary Examiner—David C. Nelms
Assistant Examiner—Que T. Le
Attorney, Agent, or Firm—Finnegan, Henderson, Farabow, Garrett & Dunner

[57] ABSTRACT

An image sensor capable of reading with high sensitivity at high speed, in which each light-receiving element consists of two photodiodes PD1 and PD2, which comprise a transparent substrate 1, a metal electrode 2, photoelectric transducing layers 3a and 3b, transparent electrodes 4a and 4b and an insulating layer 5, which layers are formed in superposition and patterned to provide PD1 and PD2 that are interconnected in such a way that the relationship of polarities of one photodiode is reverse to that of the other photodiode. The transparent electrode 4a of photodiode PD1 is connected to a common electrode wiring 7 (typically made of aluminum) via a contact hole 6a formed in the insulating layer 5, whereas the transparent electrode 4b of photodiode PD2 is connected to a lead wiring 8 (typically made of aluminum) via a contact hole 6b also formed in the insulating layer 5. The metal electrode 2 inter-connecting the photodiodes PD1 and PD2 is so specified in position that it is located only in an area that is capable of light reception.

11 Claims, 6 Drawing Sheets

IMAGE SENSOR WITH NOISE REDUCTION AND DIMINISHMENT OF RESIDUAL IMAGES

FIELD OF THE INVENTION

The present invention relates to an image sensor that is driven by a matrix array of diodes and that is to be used in the input unit of a facsimile or other equipment. More particularly, the present invention relates to an image sensor that comprises a lineal arrangement of light-receiving elements each consisting of two photodiodes that are connected in series in such a way that the relationship of polarities of one photodiode is reverse to that of the other photodiode.

BACKGROUND OF THE INVENTION

An image sensor that has heretofore been proposed for use in reading image on facsimile or other recording equipment is of such a design that one light-receiving element is formed of two photodiodes that are connected in series in such a way that the relationship of polarities of one photodiode is reverse to that of the other photodiode and that a plurality of such light-receiving elements are arranged in a lineal or matrix pattern. An exemplary structure of this type of image sensor as shown in FIGS. 10A and 10B has already been proposed in U.S. patent application Ser. No. 07/638,983. FIG. 10A is a plan view of the image sensor and FIG. 10B is a cross section of FIG. 10A taken on line J—J. As shown, one end of a photodiode PD3 is connected to a common electrode wiring 51 whereas one end of a photodiode PD4 is connected to an individual electrode wiring 53 via a lead wiring 52. Photodiode PD3 is formed in the area where a photoelectric transducing layer 60a is held between a transparent electrode 61a and a metal electrode 62, whereas photodiode PD4 is formed in the area where a photoelectric transducing layer 60b is held between a transparent electrode 61b and the metal electrode 62. The metal electrode 62 and the individual electrode wiring 53 are both composed by forming a metal layer such as chromium on a transparent substrate 70 typically made of glass.

An outline of the procedure for reading signals with the image sensor having the structure shown in FIG. 10 is described below with reference to FIG. 11. First, a series of photodiodes PD3 are scanned with a shift register SR so that they are sequentially supplied with a reverse bias voltage. As a result, electric charges are stored in the photodiodes PD3. After the scanning step, the charges stored in the photodiodes PD3 are distributed between the capacitance $C_{P3}$ of the photodiodes PD3 and the capacitance $C_{P4}$ of the photodiodes PD4. As one cycle of the scanning step is completed, the photodiodes PD3 and PD4 are illuminated with light, causing discharge in an amount that depends on the quantity of light illumination. In the next step, reset signals which are readout pulses are sequentially applied by means of the shift register SR, causing the photodiodes PD to be recharged in an amount that depends on the amount of previous discharge. As a result, a current flows through a loading resistor R, producing a potential at an output terminal $T_{OUT}$. An output signal can be obtained by reading this potential as a signal. Hence, the image sensor under consideration has the advantage that even a two-dimensional array of light-receiving elements can be driven with a driver circuit for one line.

The image sensor of the construction shown in FIGS. 10A and 10B has had the following problems. FIG. 12 is the same as FIG. 10B except that two areas A and B are hatched. As indicated by hatched area A, the photodiode PD3 has a capacitance of no light reception between the metal electrode 62 and the transparent electrode 61a (which capacitance is hereunder referred to as "additional capacitance") in the region that lies under the common electrode wiring 51 to be shielded from light; further, as indicated by hatched area B, photodiode PD4 has an additional capacitance between the metal electrode 62 and the transparent electrode 61b in the region that lies under the lead wiring 52 to be shielded from light. Because of those additional capacitances, the response of the photodiodes deteriorates and, hence, their output voltages will decrease to cause the residual image problem.

This phenomenon may be explained as follows with respect to one bit of the image sensor, or one light-receiving element. When photodiode PD4 is supplied with a readout pulse of a duration $t_r$, the anode of PD4 remains connected to a reset voltage V for the period $t_r$, (see FIG. 13), whereas the anode is grounded when no readout pulse is applied. Thus, upon application of a readout pulse, charges ($Q = C_{P3} \cdot V$) are stored in the photodiode PD3 which is connected in reverse direction with respect to reset voltage V. When the readout pulse is no longer applied, the charges $Q$ ($= C_{P3} \cdot V$) stored in the photodiode PD3 are distributed in accordance with the ratio of $C_{P3}$ to $C_{P4}$, whereby $C_{P3} \cdot Q/(C_{P3}+C_{P4})$ is assigned to the photodiode PD3 whereas $C_{P4} \cdot Q/(C_{P3}+C_{P4})$ is assigned to the photodiode PD4.

In the next step, light is incident on the photodiodes PD3 and PD4 (the storage time is $t_a$). If the photo currents generated in the photodiodes PD3 and PD4 are represented as $i_3$ and $i_4$, respectively, charges ($\Delta q_3 = i_3 \cdot t_a$) will be generated in photodiode PD3 whereas charge ($\Delta q_4 = i_4 \cdot t_a$) will be generated in photodiode PD4; the thus generated charges will be recombined with the charges already stored in the photodiodes PD3 and PD4, whereby the charge will be redistributed between the photodiodes PD3 and PD4 in accordance with the ratio determined by the following equations (1) and (2):

$$\text{PD3: } C_{P3} \cdot (Q - i_3 \cdot t_a - i_4 \cdot t_a)/(C_{P3}+C_{P4}) \qquad (1)$$

$$\text{PD4: } C_{P4} \cdot (Q - i_3 \cdot t_a - i_4 \cdot t_a)/(C_{P3}+C_{P4}) \qquad (2)$$

If, in the next step, a readout pulse is applied again, the voltage determined by the following equation (3) will be detected at the output terminal $T_{OUT}$:

$$C_{P4} \cdot Q/(C_{P3}+C_{P4}) + C_{P3} \cdot (i_3 \cdot t_a + i_4 \cdot t_a)/(C_{P3}+C_{P4}) \qquad (3)$$

The first term of eq. (3) denotes a dark output, or an output that is produced when there is no incident light and, therefore, the effective output will be expressed by the second term of eq. (3).

In practice, however, both photodiodes PD3 and PD4 form an additional capacitance—in the case of PD3, the additional capacitance is formed in the region shielded from light by the common electrode wiring 51 and in the case of PD4, it is formed in the region shielded from light by the lead wiring 52. Because of those additional capacitances, the photodiode PD3 will be reset before an adequate amount of charges are stored across the two ends while a readout pulse is being applied. As a result, the output of PD3 will decrease to produce a residual image.

SUMMARY OF THE INVENTION

The present invention has been accomplished under these circumstances and has as an object providing an image sensor that is so constructed as to prevent the formation of additional capacitances, thereby enabling images to be read with high sensitivity at high speed.

Another object of the present invention is to provide light-receiving elements of such a geometry and arrangement that noise coming into the reading circuit is reduced to enable the precise reading of images.

These objects of the present invention can be attained by an image sensor of a type that comprises a plurality of arrays of light-receiving devices each being a lineal arrangement of light-receiving devices each consisting of a first photodiode and a second photodiode, the first photodiode being formed between a metal electrode and a transparent electrode, with a photoelectric transducing layer being interposed, and connected to a reading circuit via a common electrode wiring connected to either the metal electrode or the transparent electrode, and the second photodiode being formed between a metal electrode and a transparent electrode, with a photoelectric transducing layer being interposed, and connected to a drive circuit for generating drive pulses via a lead wiring connected to either the metal electrode or the transparent electrode, the first photodiode and the second photodiode being connected in series by the transparent electrode or the metal electrode in such a way that the relationship of polarities of one photodiode is reverse to that of the other photodiode, which image sensor is characterized in that each of the first and second photodiodes is formed only in an area capable of light reception, thereby insuring that no additional capacitance is formed in either the first or second photodiode.

In the image sensor of the present invention, the light-receiving elements each of which is composed of two photodiodes interconnected in such a way that the relationship of polarities of one photodiode is reverse to that of the other photodiode are formed only in areas capable of light reception. Therefore, no additional capacitance will be formed and charges stored in the photodiodes can be read with high sensitivity and at high speed.

DETAILED DESCRIPTION OF THE PREFERRED EMBODIMENTS

Figure 1A:
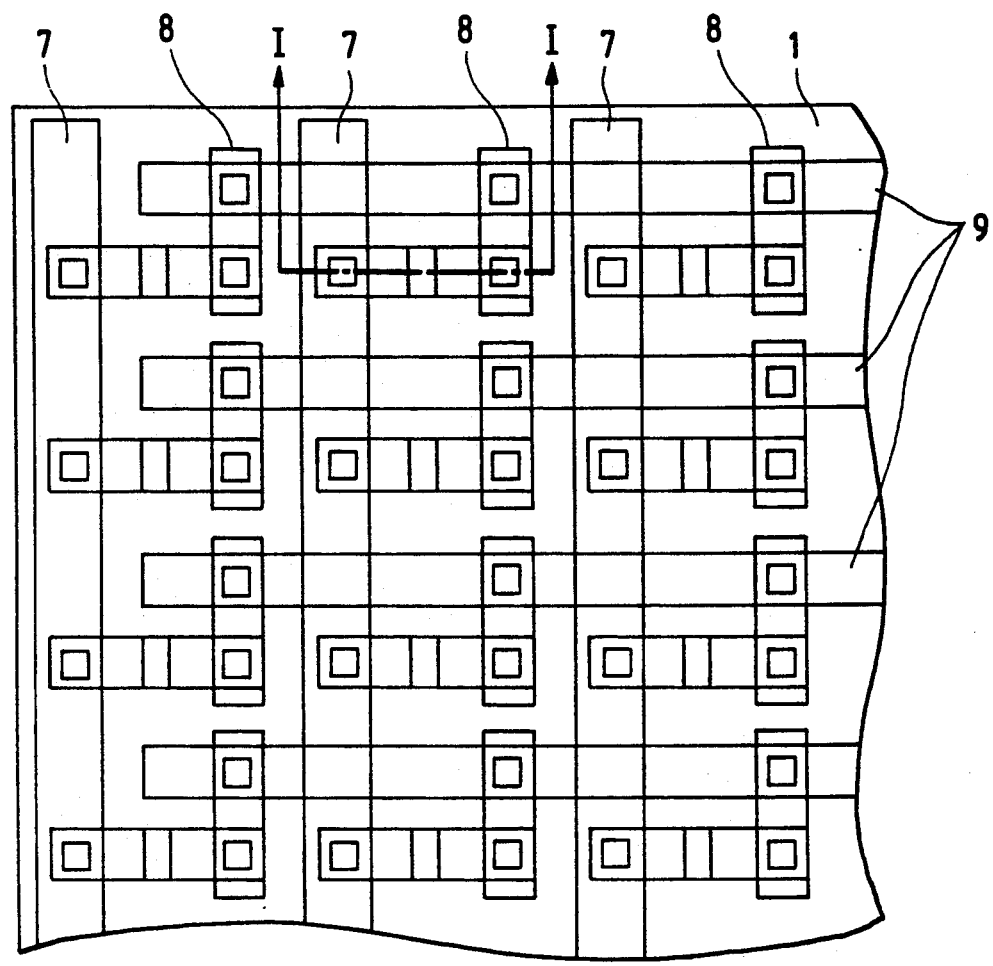
FIGS. 1A and 1B show the system configuration of an image sensor according to an embodiment of the present invention.
Figure 1B:
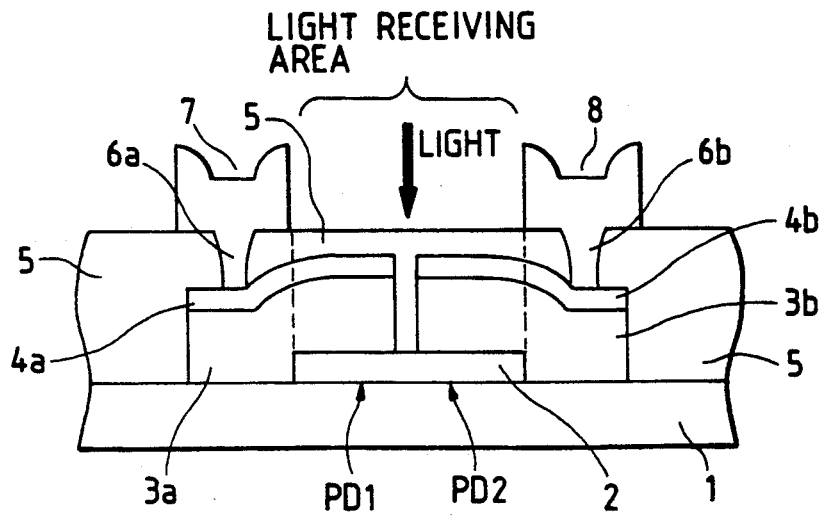

Embodiments of the present invention are described below with reference to accompanying drawings. FIGS. 1A and 1B show the system configuration of an image sensor according to an embodiment of the present invention in which it is applied to three lines of light-receiving elements; FIG. 1A is a plan view of the image sensor and FIG. 1B is a cross section of FIG. 1A taken on line I—I.

As shown in FIG. 1B, each of the light-receiving elements in the image sensor consists of two photodiodes PD1 and PD2, which comprise a transparent substrate 1 typically made of glass, a metal electrode 2 typically made of chromium, photoelectric transducing layers 3a and 3b typically made of a-Si:H, transparent electrodes 4a and 4b typically made of indium tin oxide (ITO), and an insulating layer 5 typically made of polyimide, which layers are formed in superposition and patterned to provide PD1 and PD2 that are interconnected in such a way that the relationship of polarities of one photodiode is reverse to that of the other photodiode. The transparent electrode 4a of photodiode PD1 is connected to a common electrode wiring 7 (typically made of aluminum) via a contact hole 6a formed in the insulating layer 5, whereas the transparent electrode 4b of photodiode PD2 is connected to a lead wiring 8 (typically made of aluminum) via a contact hole 6b also formed in the insulating layer 5.

The metal electrode 2 interconnecting the photodiodes PD1 and PD2 is so specified in position that it is located only in an area that is capable of light reception as shown in FIG. 1B.

The process for fabricating the image sensor shown in FIGS. 1A and 1B is described below with reference to FIG. 2.

Figure 2A:
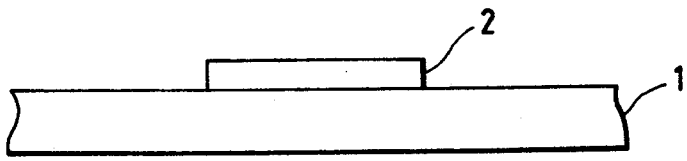
FIGS. 2A to 2E show the sequence of steps of a process for fabricating light-receiving elements having the construction shown in FIG. 1.

The process starts with depositing a metal (Cr) film in a thickness of about 70 nm on a transparent glass substrate 1 by vacuum evaporation or sputtering and etched by a photolithographic technique to form a metal electrode 2 and an individual electrode wiring 9 as shown in FIG. 2A.

Then, an intrinsic a-Si:H film and an a-Si:H film doped with an n- or p-type impurity are deposited by a plasma-assisted CVD process to form a photoelectric transducing layer 3. The photoelectric transducing layer 3 may be of any conduction type, i.e., pin, pi (ip), in (ni) or i type, with the p-layer being formed using a gas prepared by doping 100% pure silane ($SiH_4$) gas with about 1% diborane ($B_2H_6$) gas, whereas the n-layer is prepared using a gas prepared by doping 100% pure silane gas with about 1% phosphine ($PH_3$) gas. The conditions for film deposition may be as follows: substrate temperature, 200°–350° C.; thickness of the i-layer, 0.5–2 μm; and thickness of the p- and n-layers, 10–200 nm.

Figure 2B:
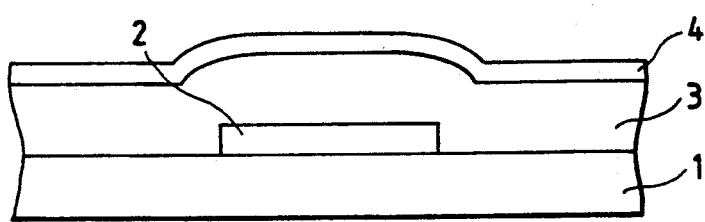
Figure 2C:
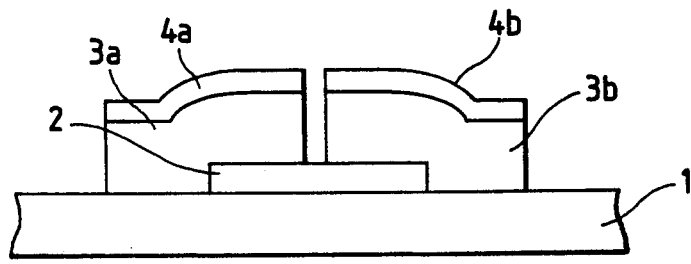

After forming the photoelectric transducing layer 3, a transparent conductive film 4 made of ITO is deposited in a thickness of 80 nm by a sputtering process (see FIG. 2B).

In the next place, a photoresist is coated over the transparent conductive film 4 to form a predetermined mask pattern for etching the film 4. Subsequently, the photoelectric transducing layer 3 is dry etched to yield the structure shown in FIG. 2C. The etchant may be a gas such as $CF_4$ or $SF_6$. If a semiconductor layer doped with a p- or n-type impurity is located just above the metal electrode 2, an i-layer should be deposited after the p- or n-type semiconductor is patterned to the same size as the metal electrode 2. An alternative method of forming this structure comprises depositing a metal film over the entire surface, depositing a semiconductor layer doped with a p- or n-type impurity, patterning and etching the deposited semiconductor layer, and consecutively etching the metal film using the same mask pattern.

Figure 2D:
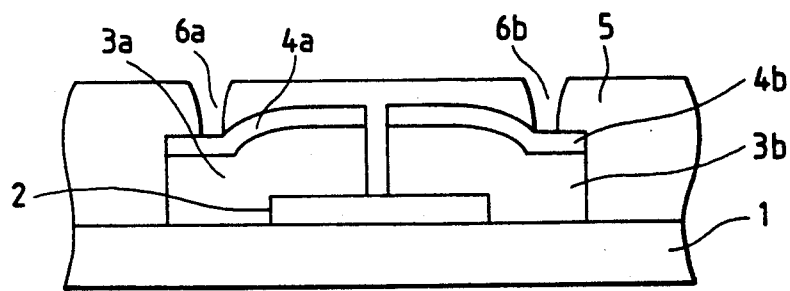

In the next step, a polyimide (e.g., PIX-1400 or PIX-8803 of Hitachi Chemical Co., Ltd. or PHOTONIES of Toray Industries, Inc.) is roll or spin coated in a thickness of about 1 μm and, thereafter, contact holes 6a and 6b are formed as shown in FIG. 2D.

Figure 2E:
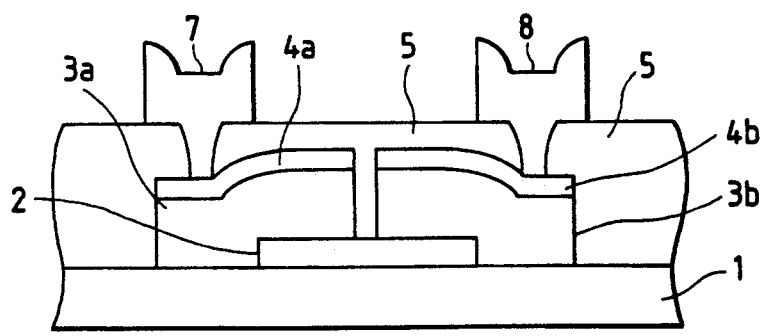

Finally, a metal (Al) film is deposited in a thickness of ca. 1 μm by vacuum evaporation or sputtering and etched by photolithography to form a common electrode wiring 7 and a lead wiring 8, thereby yielding the structure shown in FIG. 2E.

As is clear from FIG. 1B, the process described above insures that the capacitances of photodiodes PD1 and PD2 are formed only in regions capable of light reception while no additional capacitance is formed in those photodiodes. As a result, the response of the photodiodes is improved, enabling images to be read with high sensitivity and at high speed.

Figure 3:
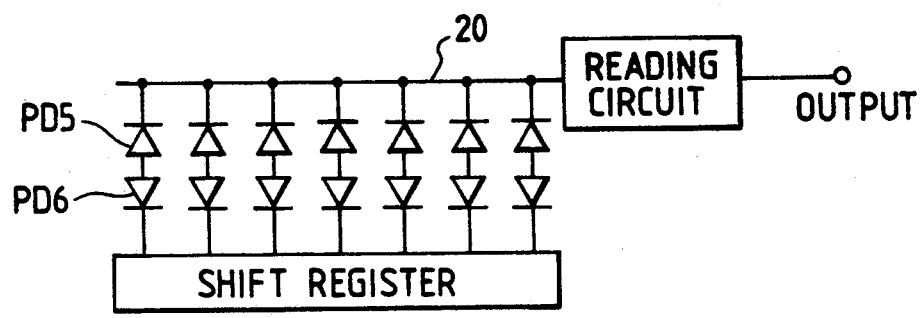
FIG. 3 shows an equivalent circuit for one line of light-receiving elements in an image sensor according to the embodiment of the present invention.
Figure 11:
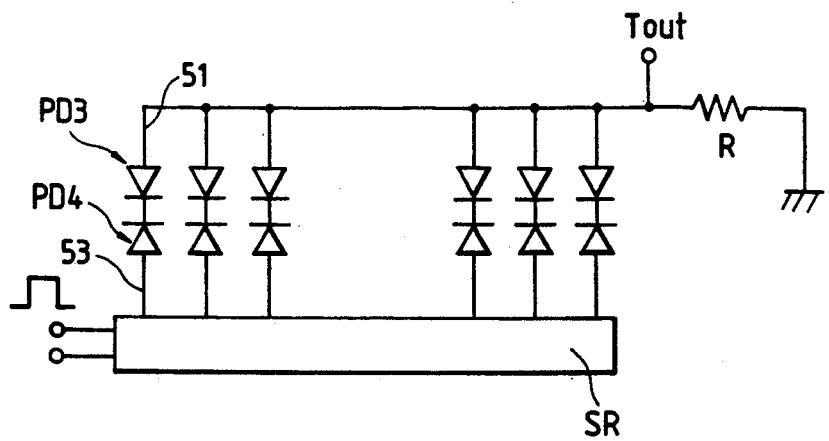
FIG. 11 shows an equivalent circuit for one line of light-receiving elements in a conventional image sensor.
Figure 12:
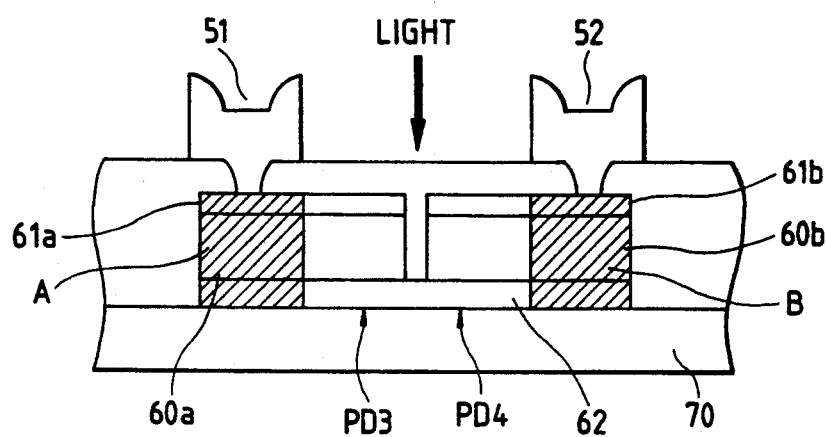
FIG. 12 is a diagram illustrating the problem that occurs in a conventional image sensor.
Figure 13:
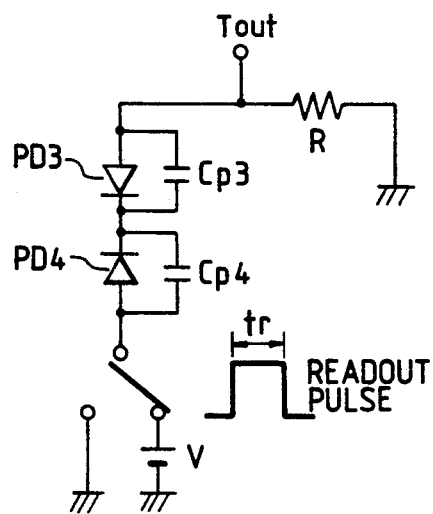
FIG. 13 shows an equivalent circuit for one bit of light-receiving elements in an image sensor.

Another embodiment of the present invention is described below. The foregoing embodiments relate to the case where two photodiodes are interconnected with the cathode of one photodiode being connected to the cathode of the other as shown in FIG. 11. If desired, the two photodiodes may be interconnected as shown in FIG. 3 in such a way that the anode of one photodiode PD5 is connected to the anode of the other photodiode PD6. In a light-receiving element consisting of two photodiodes neither of which are shielded from light and that are connected in series in such a way that the relationship of polarities of one photodiode is reverse to that of the other, the application of a positive or negative pulse to one photodiode will photodiode will cause a sufficient amount of charges to build up to have both photodiodes reversely biased; at the same time, the accumulated light current will be transferred to the common electrode and converted to a voltage in the reading circuit, thereby reading the charges. If the pulse applied is positive, a positive voltage will develop in the reading circuit and, if the pulse applied is negative, a negative voltage will develop in the reading circuit. The result is the same irrespective of whether the cathodes of the two photodiodes are interconnected as shown in FIG. 11 or whether the anodes are interconnected as shown in FIG. 3. Shown by 20 in FIG. 3 is a common electrode for reading charges.

Figure 4:
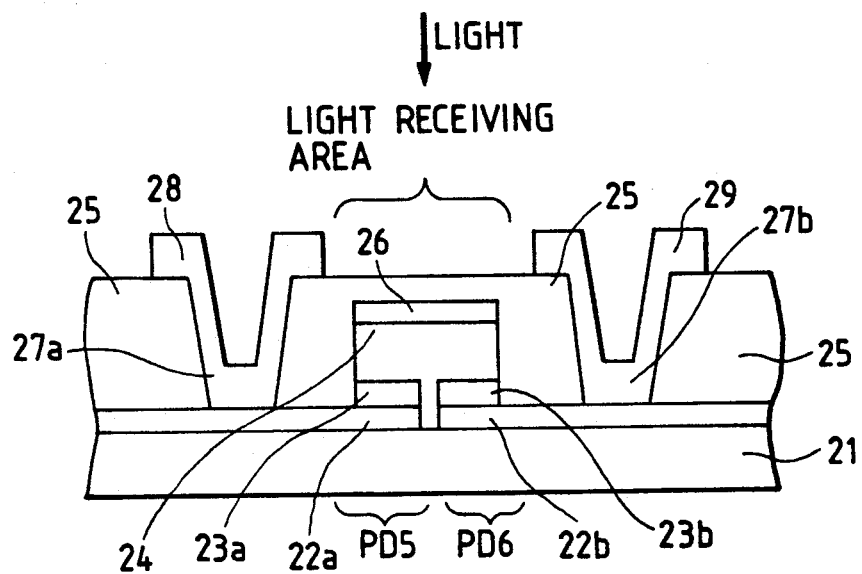
FIG. 4 is a diagram showing a structure of the light-receiving elements used in the image sensor shown in FIG. 3.

FIG. 4 shows an example of the structure of a light-receiving element that consists of two photodiodes interconnected in such a way that the anode of one photodiode is connected to the anode of the other photodiode as shown in FIG. 3.

As shown in FIG. 4, each of the light-receiving elements in the image sensor consists of two photodiodes PD5 and PD6, which comprise a transparent substrate 21 typically made of glass, metal electrodes 22a and 22b typically made of chromium, n+ a-Si:H layers 23a and 23b for establishing ohmic contact, a photoelectric transducing layer 24 typically made of a-Si:H, a transparent electrode 26 typically made of ITO, and an insulating layer 25 typically made of polyimide, which layers are formed in superposition and patterned to provide photodiodes PD5 and PD6 that are interconnected in such a way that the anode of PD5 is connected to the anode of PD6. The metal electrode 22a of photodiode PD5 is connected to a common electrode wiring 28 (typically made of aluminum) via a contact hole 27a formed in the insulating layer 25, whereas the metal electrode 22b of photodiode PD6 is connected to a lead wiring 29 (typically made of aluminum) via a contact hole 27b also formed in the insulating layer 25. The transparent electrode 26 interconnecting the photodiodes PD5 and PD6 is so specified in position that it is located only in an area that is capable of light reception. The photodiodes may be of any conduction type, i.e., pin, pi (ip), in (ni) or i type. Needless to say, the structure shown in FIG. 4 can be formed by lithographic techniques as in the case shown in FIG. 2.

The geometry and arrangement of two photodiodes that are to be used in the present invention are described below.

As already pointed out, each of the light-receiving element in the image sensor of the present invention consists of two photodiodes that are interconnected in such a way that the relationship of polarities of one photodiode is reverse to that of the other photodiode and this enables the accumulated charges to be red with high sensitivity and at high speed. A problem with this system configuration is that if the quantity of light incident on one photodiode is much different from the quantity of light incident on the other photodiode, a current will flow out of the light-receiving element to come into the reading circuit, causing noise to the system.

Figure 5:
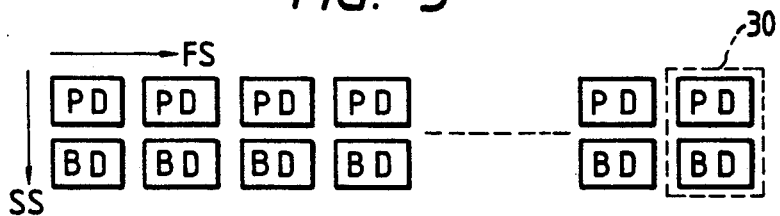
FIGS. 5 and 6 are diagrams showing an example of the layout of two types of the photodiodes.

Referring to the structure shown in FIG. 1B, let us call photodiodes PD1 and PD2 by convenient names a photodiode PD and a blocking diode BD, respectively. One possible way to arrange photodiodes is as shown in FIG. 5: a light-receiving element consists of a photodiode PD and a blocking diode BD that are juxtaposed in the sub-scanning (SS) direction whereas the individual photodiodes PDs and blocking diodes composing one line are arranged in the main-scanning (FS) direction. A single light-receiving element is indicated by 30 in FIG. 5. The image of documents to be sent by facsimiles and other apparatus of a similar type often contains straight lines that extend in the FS direction and it often occurs that those lines are projected only toward the photodiode PD in each light-receiving element, not toward the blocking diode BD or, conversely, the lines are projected only toward the blocking diode BD, not toward the photodiode PD. If the photodiode PD and the blocking diode BD receive the same quantity of incident light, the voltage across the photodiode PD will be equal to the voltage across the blocking diode BD and there will be no current flowing out of the light-receiving element into the reading circuit, which would otherwise cause noise. However, if the quantity of incident light differs between the photodiode PD and the blocking diode BD, the voltage across PD will no longer be equal to the voltage across BD, producing a current that flows into the reading circuit to cause noise. The amount of the noise current is maximal when an all black image is projected to either one of the photodiode PD and the blocking diode BD while an all white image is projected to the other. Hence, arranging photodiodes as shown in FIG. 5 is not desired.

Figure 6:
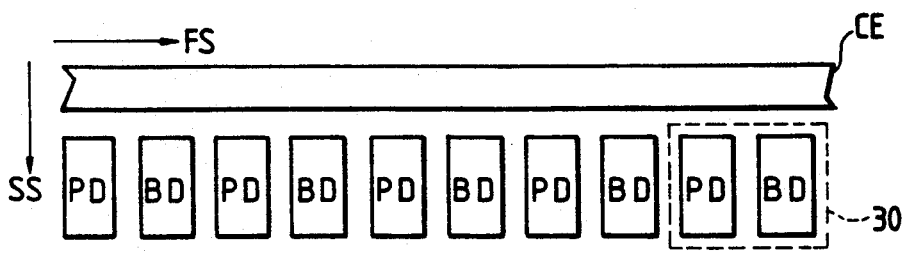

Under the circumstances, one may opt to compose each light-receiving element by juxtaposing the photodiode PD and the blocking diode BD in the FS direction. If they are arranged in this way, the photodiode PD and the blocking diode BD will receive approximately equal quantities of incident light, whereby effective noise damping can be accomplished. Shown by CE in FIG. 6 is the common electrode wiring connected to the reading circuit. The same definition applies to the following description referenced to FIGS. 7 to 9.

If the photodiode PD and the blocking diode BD are juxtaposed in the SS direction to compose a light-receiving element, the positions of the photodiode PS and the blocking diode BD may be replaced for successive light-receiving elements 30 that are adjacent in the FS direction. An advantage of this layout is that even if noise occurs in individual light-receiving elements, the noise current will flow in opposite direction in adjacent light-receiving elements to be canceled out for the image sensor taken as a whole.

Figure 7:
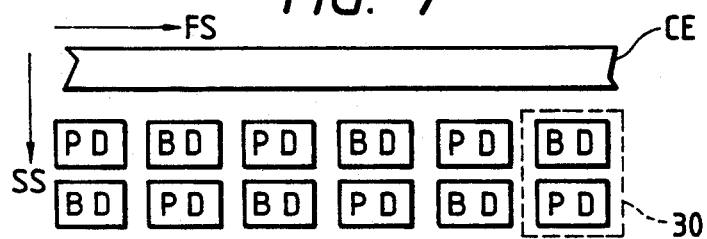
FIG. 7 is a diagram showing a preferred layout of two types of the photodiodes.
Figure 8:
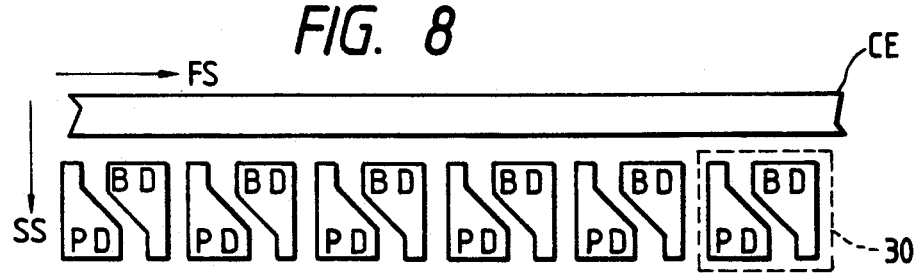
FIG. 8 is a diagram showing another preferred layout of two types of the photodiodes.
Figure 9:
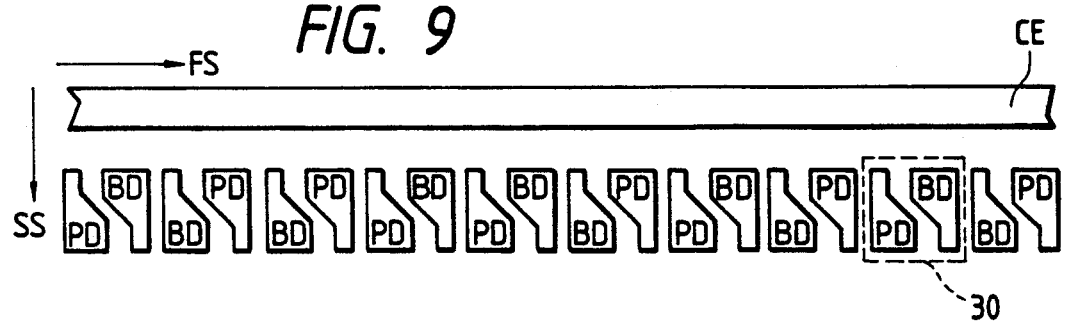
FIG. 9 is a diagram showing two examples of yet another preferred geometry and layout of two types of the photodiodes.
Figure 10A:
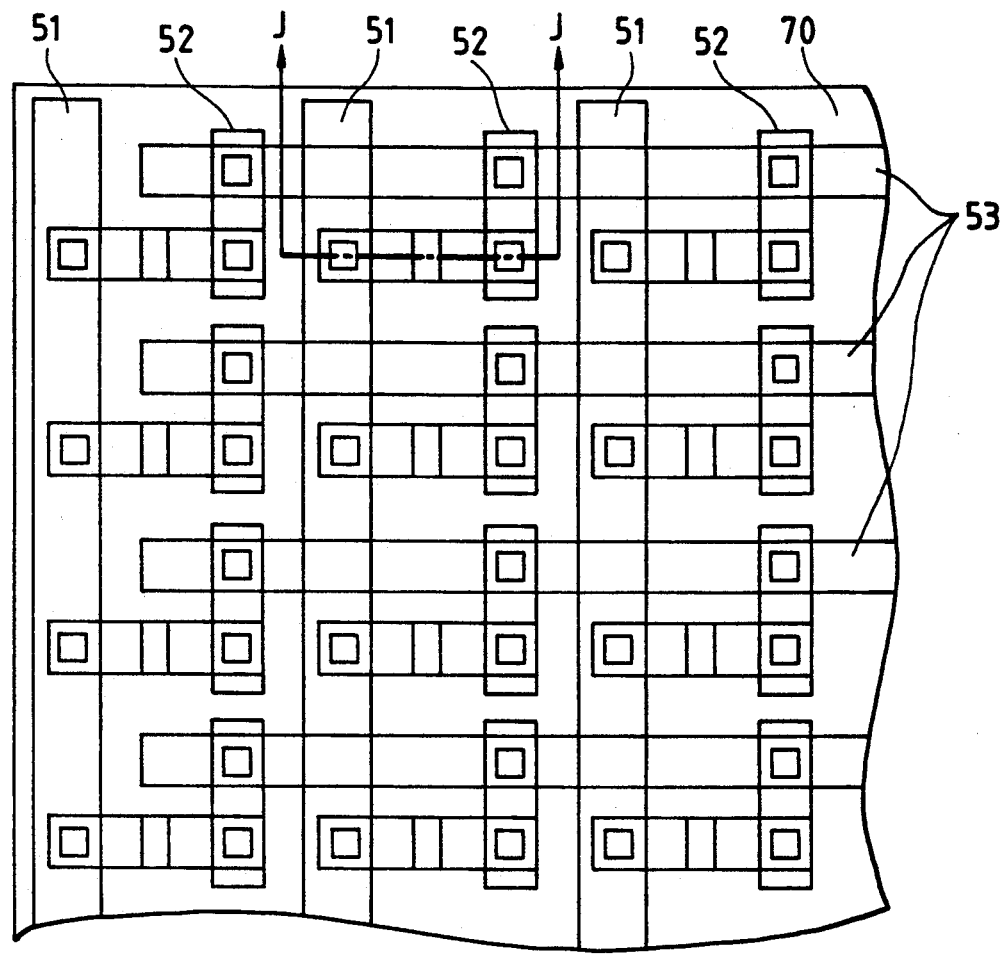
FIGS. 10A and 10B show the system configuration of a conventional image sensor.
Figure 10B:
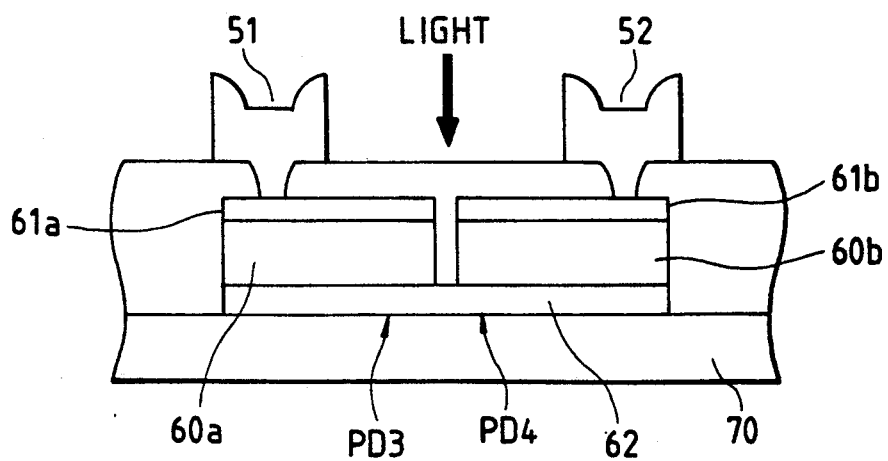

The geometry of the photodiode PD and the blocking diode BD is by no means limited to the rectangular shape illustrated in FIGS. 6 and 7. They may be designed to have a generally triangular or trapezoidal shape as shown in FIGS. 8 and 9, with the photodiode PD having an oblique line that faces a corresponding oblique line of the blocking diode BD. In this case, photodiodes PDs and blocking diodes BDs may be arranged regularly in the FS direction as shown in FIG. 8; alternatively, the positions of photodiodes PDs and blocking diodes BDs may be replaced regularly or irregularly for successive light-receiving elements 30 that are adjacent in the FS direction.

Shaping the photodiode PD and the blocking diode BD in such a way that they face each other at oblique lines offers the advantage that effective noise damping can be accomplished not only with the images of general documents and photographs but also with images that contain hatched or shaded areas as exemplified by design drawings and images prepared by CAD.

While the image sensor of the present invention has been described on the foregoing pages with particular reference to the case where it is applied to a line sensor; it should be noted that light-receiving elements can be arranged in a two-dimensional layout. It also goes without saying that a color image sensor can be constructed by disposing color filters in front of the light-receiving elements in the image sensor of the present invention.

What is claimed is:

1. An image sensor having at least one light receiving element, each said at least one light receiving element comprising:
   a first diode, a second diode serially connected to said first diode in reverse polarity, each said first and second diodes including a first electrode, a second electrode overlaying said first electrode, and a photoelectric transducing layer disposed between said first and second electrodes;
   a first wiring connected to one of said first and second electrodes of said first diode; and
   a second wiring connected to one of said first and second electrodes of said second diode;
   said first and second wirings defining a boundary of a light receiving area of said transducing layers of said first and second diodes for receiving incident light, at least one of said electrodes of said first and second diodes being essentially entirely contained within said light receiving area.

2. An image sensor as claimed in claim 1, wherein one of said first and second electrodes constitutes a common electrode which is in common with said first and second diodes.

3. An image sensor as claimed in claim 1, wherein one of said first and second electrodes is transparent.

4. An image sensor comprising:
   a plurality of light receiving elements, each of said light receiving elements including a photodiode and a blocking diode serially connected to one another in reverse polarity;
   said plurality of light receiving elements being positioned adjacent to one another in a main scanning direction, each light receiving element being arranged with the photodiode of one of the plurality of light receiving elements adjacent to the blocking diode of the adjacent light receiving element.

5. An image sensor as claimed in claim 4, wherein said photodiode and blocking diode are arranged along a sub scanning direction which is perpendicular to said main scanning direction.

6. An image sensor as claimed in claim 4, wherein said photodiode and blocking diode are arranged obliquely with respect to both said main scanning direction and a sub scanning direction which is perpendicular to said main scanning direction.

7. An image sensor as claimed in claim 4, wherein said photodiode and blocking diode have an oblique edge with respect to both said main scanning direction and a sub scanning direction which is perpendicular to said main scanning direction, each of said oblique edges opposing one another.

8. An image sensor comprising a plurality of light receiving elements, each of said light receiving elements including a photodiode and a blocking diode serially connected to one another in reverse polarity, each said photodiode and blocking diode including a first electrode, a second electrode overlaying said first electrode, and a photoelectric transducing layer disposed between said first and second electrodes;
   a first wiring connected to one of said first and second electrodes of said photodiode; and
   a second wiring connected to one of said first and second electrodes of said blocking diode;
   said first and second wirings defining a boundary of a light receiving area of said transducing layers of said photodiode and blocking diode for receiving incident light, at least one of said electrodes of said photodiode and blocking diode being essentially entirely contained within said light receiving area;
   said plurality of light receiving elements being positioned adjacent to one another in a main scanning direction, each light receiving element being arranged with the photodiode of one of the plurality of light receiving elements adjacent to the blocking diode of the adjacent light receiving element.

9. An image sensor as claimed in claim 8, wherein said photodiode and blocking diode are arranged along a sub scanning direction which is perpendicular to said main scanning direction.

10. An image sensor as claimed in claim 8, wherein said photodiode and blocking diode are arranged obliquely with respect to both said main scanning direction and a sub scanning direction which is perpendicular to said main scanning direction.

11. An image sensor as claimed in claim 8, wherein said photodiode and blocking diode have an oblique edge with respect to both said main scanning direction and a sub scanning direction which is perpendicular to said main scanning direction, each of said oblique edges opposing one another.

* * * * *